United States Patent
Yon (10) Patent No.: US 9,911,785 B2
(45) Date of Patent: Mar. 6, 2018

(54) METHOD FOR MAKING A DEVICE FOR DETECTING ELECTROMAGNETIC RADIATION COMPRISING A LAYER OF GETTER MATERIAL

(71) Applicant: Commissariat a l'energie atomique et aux energies alternatives, Paris (FR)

(72) Inventor: Jean-Jacques Yon, Sassenage (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 15/581,022

(22) Filed: Apr. 28, 2017

(65) Prior Publication Data
US 2017/0317137 A1 Nov. 2, 2017

(30) Foreign Application Priority Data
Apr. 28, 2016 (FR) ...................... 16 53764

(51) Int. Cl.
*H01L 21/42* (2006.01)
*H01L 31/00* (2006.01)
(Continued)

(52) U.S. Cl.
CPC .......... *H01L 27/14698* (2013.01); *G01J 5/10* (2013.01); *H01L 27/1462* (2013.01); *G01J 5/0853* (2013.01); *G01J 2005/103* (2013.01)

(58) Field of Classification Search
CPC ........ H01L 51/0027; H01L 27/14; H01F 7/06
See application file for complete search history.

(56) References Cited

U.S. PATENT DOCUMENTS

2002/0175284 A1 11/2002 Vilain
2010/0314544 A1* 12/2010 Ouvrier-Buffet ......... G01J 5/04
250/338.4
(Continued)

FOREIGN PATENT DOCUMENTS

EP    1 243 903 A2    9/2002
EP    2 743 659 A1    6/2014

OTHER PUBLICATIONS

French Preliminary Search Report (with Written Opinion) dated Feb. 1, 2017 in French Application 16 53764 filed on Apr. 28, 2016 (with English Translation of Categories of Cited Documents).

*Primary Examiner* — Mohammad Choudhry
(74) *Attorney, Agent, or Firm* — Oblon, McClelland, Maier & Neustadt, L.L.P.

(57) ABSTRACT

A method makes an electromagnetic radiation detecting device including at least one thermal detector with an absorbent membrane suspended above a substrate, intended to be located in a sealed cavity. The method includes depositing, on the substrate, a gettering metallic layer including a metallic material with a gettering effect; depositing a carbonaceous sacrificial layer of amorphous carbon on the gettering metallic layer; depositing at least one sacrificial mineral layer on the carbonaceous sacrificial layer; chemical-mechanical planarization of the sacrificial mineral layer; fabricating the thermal detector so that the absorbent membrane is produced on the sacrificial mineral layer; removing the sacrificial mineral layer; and removing the carbonaceous sacrificial layer.

13 Claims, 5 Drawing Sheets

(51) Int. Cl.
*H01L 27/14* (2006.01)
*H01L 27/146* (2006.01)
*G01J 5/10* (2006.01)
*G01J 5/08* (2006.01)

(56) References Cited

U.S. PATENT DOCUMENTS

| | | |
|---|---|---|
| 2014/0319350 A1 | 10/2014 | Yon et al. |
| 2016/0023888 A1 | 1/2016 | Quevy et al. |
| 2016/0023889 A1 | 1/2016 | Quevy et al. |
| 2016/0025664 A1 | 1/2016 | Quevy et al. |
| 2016/0097681 A1 | 4/2016 | Buchan et al. |
| 2016/0355397 A1 | 12/2016 | Quevy et al. |
| 2016/0362295 A1 | 12/2016 | Quevy et al. |

* cited by examiner

METHOD FOR MAKING A DEVICE FOR DETECTING ELECTROMAGNETIC RADIATION COMPRISING A LAYER OF GETTER MATERIAL

TECHNICAL FIELD

The field of the invention is that of devices for detecting electromagnetic radiation, in particular infrared or terahertz radiation, comprising at least one thermal detector encapsulated in a sealed cavity, a thin layer of a getter material being located in the sealed cavity. The invention applies notably to the field of infrared imaging and thermography.

PRIOR ART

A device for detecting electromagnetic radiation, for example infrared or terahertz radiation, may comprise a matrix of so-called elementary thermal detectors, each detector comprising an absorbent portion able to absorb the electromagnetic radiation to be detected.

To ensure thermal isolation of the thermal detectors, the absorbent portions are usually in the form of membranes suspended above the substrate by anchoring pillars, and are isolated thermally from the latter by holding arms and thermal insulation. These anchoring pillars and insulating arms also have an electrical function, connecting the suspended membranes electrically to a reading circuit generally arranged in the substrate.

The reading circuit is usually in the form of a CMOS circuit. It allows application of a command signal to the thermal detectors as well as the reading of detection signals generated by the thermal detectors in response to absorption of the electromagnetic radiation to be detected. The reading circuit comprises various levels of electrical interconnection formed of metal lines separated from one another by so-called intermetal dielectric layers. A pad for electrical connection of the reading circuit is arranged on the substrate in such a way that it can be contacted from outside the detection device.

Thus, document EP2743659 describes two examples of devices for detecting infrared radiation, the method of fabrication of which uses mineral sacrificial layers identical or similar to the intermetal dielectric layers of the reading circuit.

Figure 1A:
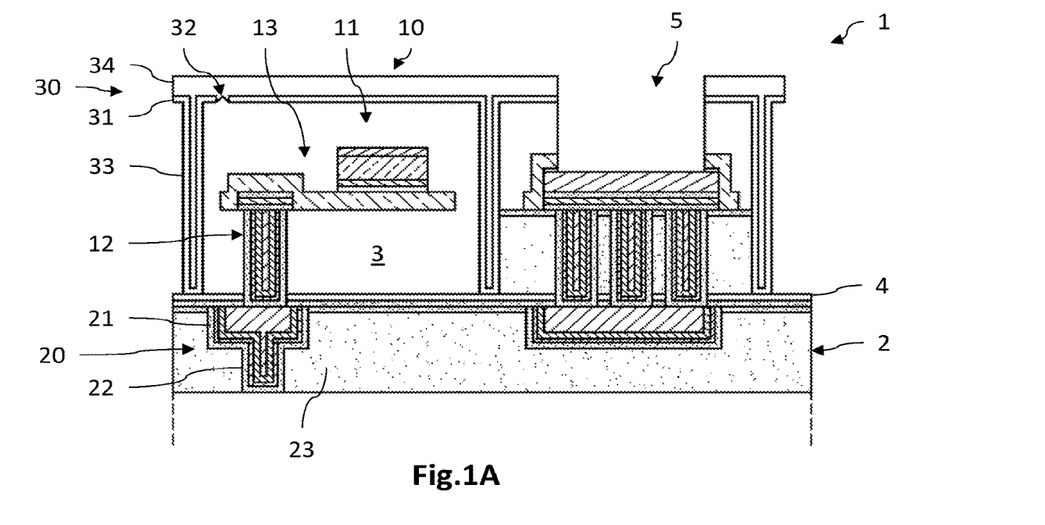
FIGS. 1A and 1B, already described, are schematic sectional views of different examples of detecting devices according to the prior art.

FIG. 1A illustrates a first example of a detecting device 1 that comprises a plurality of thermal detectors 10 each comprising an absorbent membrane 11 suspended above the substrate 2 and connected electrically to a portion 21 of metal line of the CMOS reading circuit 20, the metal line belonging in this case to a penultimate level of electrical interconnection of the CMOS circuit 20. The thermal detectors 10 are fabricated using sacrificial layers of a mineral material identical or similar to that of the intermetal dielectric layers 23 of the CMOS circuit 20. An electrical connection pad 5 is arranged in such a way that it can connect the CMOS circuit 20 from outside the detecting device 1. An etching barrier layer 4 extends continuously over the surface of the substrate 2, so as to block the progress of chemical etching employed in the step of removal of the mineral sacrificial layers and thus preserve the CMOS circuit 20. The thermal detector or detectors 10 are encapsulated in a sealed cavity 3 partly delimited by an encapsulating layer 31 covered with a sealing layer 34, the latter notably ensuring sealing of at least one release vent 32 allowing evacuation of the etching products during the step of removal of the mineral sacrificial layers.

Figure 1B:
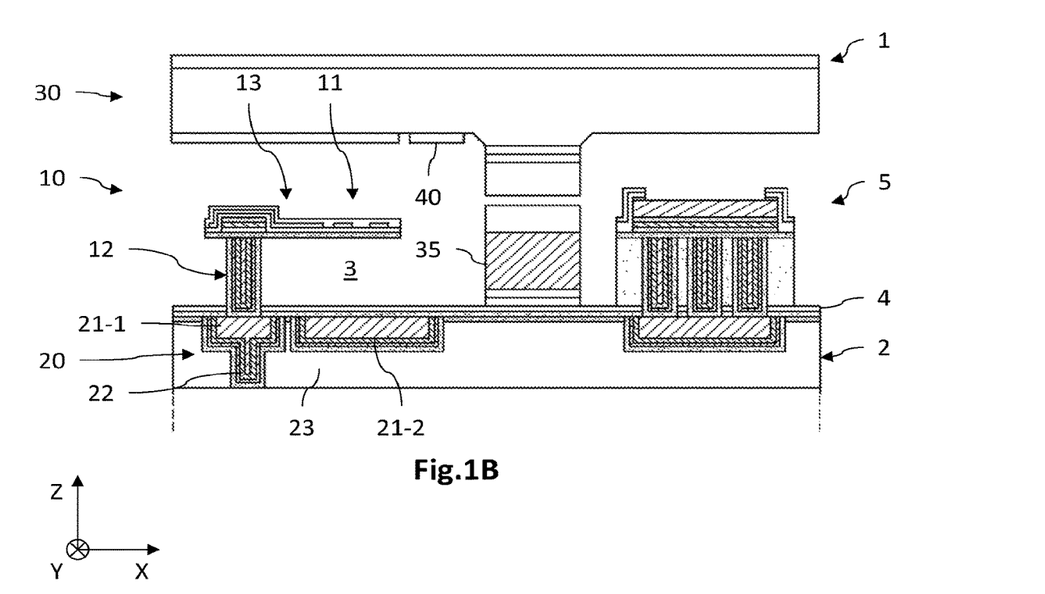

FIG. 1B illustrates a second example of a detecting device 1, whose thermal detectors 10 are also fabricated using mineral sacrificial layers. An etching barrier layer 4 also provides protection of the intermetal dielectric layers 23 of the CMOS circuit 20 during the step of removal of the mineral sacrificial layers. A second portion 21-2 of the same metal line as that of portion 21-1, located opposite the absorbent membrane 11 and covered by the etching barrier layer 4, provides a function of optical reflection of the wavelengths to be detected. The thermal detector or detectors 10 are encapsulated in a sealed cavity 3 formed in this case by an encapsulating structure 30 which in this case takes the form of an add-on cover, assembled on the substrate 2 by means of a hermetic seal 35. A layer 40 comprising a getter material is located on a lower surface of the add-on cover 30, for providing gas pumping inside the sealed cavity 3.

However, there is a need for a method for making a device for detecting electromagnetic radiation, which comprises the use of at least one sacrificial mineral layer, and in which a layer of a getter material is deposited on the surface of the substrate, inside the sealed cavity.

There is also a need for a method for making a device for detecting electromagnetic radiation that makes it possible to form a thin encapsulating layer extending above and around the thermal detector or detectors.

There is also a need for a method for making a device for detecting electromagnetic radiation with improved sensitivity of detection.

SUMMARY OF THE INVENTION

The aim of the invention is to overcome, at least partly, the drawbacks of the prior art, and more particularly to propose a method for making a device for detecting electromagnetic radiation comprising at least one thermal detector, the latter comprising an absorbent membrane suitable for absorbing the radiation to be detected, suspended above a substrate, wherein the thermal detector is intended to be located in a sealed cavity. The method comprises at least the following steps:

depositing, on the substrate, a so-called gettering metallic layer comprising a metallic material with a gettering effect;

depositing, so as to cover the gettering metallic layer, a so-called carbonaceous sacrificial layer comprising a carbonaceous material of amorphous carbon that can be etched selectively with respect to the gettering metallic layer by a second chemical etching;

depositing, on the carbonaceous sacrificial layer, at least one sacrificial mineral layer comprising a mineral material that can be etched selectively with respect to the carbonaceous sacrificial layer by a first chemical etching;

chemical-mechanical planarization of the sacrificial mineral layer;

fabrication of the thermal detector so that the absorbent membrane is produced on the sacrificial mineral layer;

removal of the sacrificial mineral layer by said first chemical etching;

removal of the carbonaceous sacrificial layer by said second chemical etching.

The step of chemical-mechanical planarization or polishing (CMP) is a step for obtaining a substantially flat surface of the deposited sacrificial mineral layer, on which the absorbent membrane is produced. It is a question of applying a chemical action and a mechanical action simultaneously on the upper surface of the sacrificial mineral layer. The mechanical action is performed conventionally with a polishing head, which applies an abrasive with rotation against the surface of the mineral layer.

Certain preferred, but non-limiting aspects of this detecting device are as follows.

The metallic material with a gettering effect may be selected from titanium, zirconium, vanadium, chromium, cobalt, iron, manganese, palladium, barium, and/or aluminium.

The mineral material may be a material comprising at least silicon oxide or silicon nitride.

The first chemical etching may be chemical attack in an acid medium, preferably with hydrofluoric acid in the vapour phase.

The second chemical etching may be dry etching by oxygen plasma.

The gettering metallic layer may rest on and be in contact with an electrically insulating layer of the substrate, or may rest on and be in contact with an etching barrier layer made of a material that is able to stop the first chemical etching and that covers an upper face of the substrate.

The carbonaceous sacrificial layer may cover the gettering metallic layer.

The gettering metallic layer may comprise several separate portions, at least a first portion of which is located under the absorbent membrane.

The step of fabricating the thermal detector may comprise the formation of an encapsulating structure of said thermal detector, said encapsulating structure comprising an encapsulating layer extending around and above said thermal detector so as to define, with the substrate, the sealed cavity in which said thermal detector is located, the encapsulating layer comprising at least one through hole, called a release vent. The materials removed during the first and second chemical etchings may be evacuated through said release vent.

The encapsulating layer may be formed of at least one material comprising silicon.

The encapsulating layer may comprise a peripheral wall that extends around said thermal detector, and is in contact with the gettering metallic layer.

The thermal detector may comprise at least one anchoring pillar for holding the absorbent membrane in place above the substrate, the anchoring pillar being in contact with the gettering metallic layer.

BRIEF DESCRIPTION OF THE DRAWINGS

Other aspects, aims, advantages and features of the invention will become clearer on reading the following detailed description of preferred embodiments of the invention, given as non-limiting examples, and referring to the appended drawings, where.

DETAILED ACCOUNT OF PARTICULAR EMBODIMENTS

In the figures and in the rest of the description, the same references represent identical or similar elements. Moreover, the various elements are not shown to scale, for greater clarity of the figures. Moreover, the various embodiments and variants are not exclusive of one another and may be combined together. Unless stated otherwise, the terms "roughly", "about", "of the order of" mean to within 10%.

The invention relates to the fabrication of a device for detecting electromagnetic radiation 1 suitable for detecting infrared or terahertz radiation. It comprises at least one thermal detector 10 intended to be located in a sealed cavity 3, and a layer 40 comprising a material with a gettering effect present on the substrate 2 within the sealed cavity 3. This material with a gettering effect, also called getter material, is a material that is exposed to the atmosphere of the sealed cavity 3, and is able to perform gas pumping by absorption and/or adsorption.

This getter material is a metallic material that may be selected from titanium, zirconium, vanadium, chromium, cobalt, iron, manganese, palladium, barium and/or aluminium, or an alloy of these metals such as TiZrV. As mentioned later on, the gettering metallic layer 40 may also be reflective at the wavelengths to be detected, or may be used for improving the bond of certain elements of the detecting device 1 to the substrate 2.

The invention also relates to the deposition and then etching of a so-called protective sacrificial layer 50, that is able to protect the gettering metallic layer 40 during a chemical etching step employed subsequently for removing a sacrificial mineral layer 60A, 60B, such as chemical attack in an acid medium, for example with hydrofluoric acid in the vapour phase.

This protective sacrificial layer 50 comprises a carbonaceous material, i.e. a material formed of at least one type of chemical species comprising carbon atoms. It may thus be a mineral material such as amorphous carbon, optionally of the DLC (diamond-like carbon) type, or an organic material such as polyimide. Carbon of the DLC type is amorphous carbon with a high level of hybridization to $sp^3$ carbon. Preferably, the carbonaceous material does not comprise silicon, so as to avoid the presence of possible residues at the end of the step of etching this layer 50.

The carbonaceous sacrificial layer 50 comprising, or consisting of, such a material is thus substantially inert to the chemical etching carried out subsequently for removing the sacrificial mineral layer 60A, 60B. "Substantially inert" means that the carbonaceous material barely reacts with the acid medium used in this etching step, or reacts little, so that the carbonaceous sacrificial layer 50 is not etched through its entire thickness at the end of this etching step, the gettering metallic layer 40 thus being protected against any degradation by the carbonaceous sacrificial layer 50.

The carbonaceous sacrificial layer 50 may moreover be removed by chemical etching such as dry chemical etching, for which an etching agent is oxygen contained in a plasma.

The invention also relates to the deposition and then etching of at least one sacrificial layer 60A, 60B comprising a mineral, or inorganic, material, the so-called sacrificial mineral layer.

The mineral material is in this case a silicon-based dielectric material for producing an intermetal dielectric layer 23 of the reading circuit 20, i.e. an electrically insulating material, with for example a dielectric constant, or relative permittivity, less than or equal to 3.9, making it possible to limit the parasitic capacitance between the interconnections. It is a material that does not comprise carbon chains, such as a silicon oxide $SiO_x$ or a silicon nitride $Si_xN_y$, or even an organosilicon material such as SiOC, SiOCH, or a material of the fluorinated glass type such as SiOF.

A sacrificial mineral layer 60A, 60B comprising, or consisting of, such a material, may be removed by wet chemical etching such as chemical attack in an acid medium, for example with hydrofluoric acid in the vapour phase. Wet etching generally means that the etching agent is in the liquid phase or in the vapour phase, and, in the context of the invention, in the vapour phase.

FIGS. 2A to 2G illustrate different steps in making a detecting device 1 according to a first embodiment. Several steps, apart from the steps of depositing the getter material, depositing and removing the carbonaceous sacrificial layer 50, may be similar or identical to those of the method described in document EP2743659.

Here and for the rest of the description, a three-dimensional direct reference (X,Y,Z) is defined, where the plane (X,Y) is roughly parallel to the plane of a substrate 2 of the detecting device 1, the Z axis being oriented in a direction roughly orthogonal to the plane of the substrate 2. The terms "vertical" and "vertically" are understood as relating to an orientation roughly parallel to the Z axis, and the terms "horizontal" and "horizontally" as relating to an orientation roughly parallel to the plane (X,Y). Moreover, the terms "lower" and "upper" are understood as relating to an increasing positioning on moving away from the substrate 2 in the +Z direction.

Figure 2A:
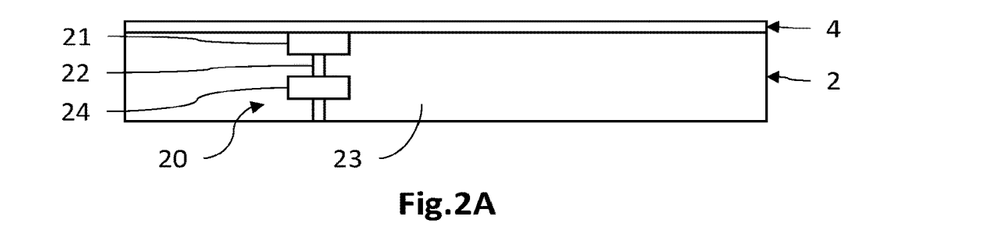
FIGS. 2A to 2H are schematic sectional views of different steps of a method for making a detecting device according to a first embodiment.

Referring to FIG. 2A, a substrate 2 is produced comprising a reading circuit 20 of the CMOS circuit type. The CMOS circuit 20 is able to supply and measure the signal delivered by the thermal detectors 10. It thus comprises active electronic components, such as diodes, transistors, capacitors, resistances, etc., connected electrically by metallic interconnections to the thermal detectors 10, as well as to a connecting pad (not shown) intended to connect the detecting device 1 electrically to an external electronic device. The reading circuit 20 in this case comprises a level of electrical interconnection comprising a first portion 21 of a metal line, connected electrically to a portion 24 of a metal line of a lower level of electrical interconnection by a conducting via 22. The vias 22 and metal lines are separated from one another by intermetal dielectric layers 23. The substrate 2 in this case comprises an upper face, at the level of which the portion 21 of metal line as well as the intermetal dielectric layer 23 emerge. This step of making the substrate 2 may be identical or similar to that described in document EP2743659. Thus, for purposes of illustration, the conducting vias 22 and the portions 21, 24 of metal lines may be made of copper, aluminium or tungsten, by a damascene process, in which trenches made in the intermetal dielectric layer 23 are filled with copper. The copper or tungsten may optionally be inserted transversely between vertical layers of titanium nitride, tantalum nitride or some other. The portion of metal line may be made flush with the level of the upper face of the intermetal dielectric layer 23 by a technique of chemical-mechanical polishing (CMP).

An etching barrier layer 4 is deposited on at least part of the upper face of the substrate 2. This etching barrier layer thus continuously covers the intermetal dielectric layer 23 and the portion 21 of metal line that together form the upper face of the substrate 2. The etching barrier layer 4 comprises a material that is substantially inert to chemical etching employed subsequently for removing a carbonaceous sacrificial layer 50, more precisely oxygen-plasma dry chemical etching. This material may moreover be substantially inert to chemical etching employed subsequently for removing the mineral sacrificial layer or layers 60A, 60B, more precisely chemical attack in HF in the vapour phase, in the case when the carbonaceous sacrificial layer 50 does not completely cover the upper face of the substrate 2. The etching barrier layer 4 thus prevents the intermetal dielectric layers 23 of the CMOS circuit 20 being etched during the steps of removing the sacrificial layers. It may be formed of alumina $Al_2O_3$, or of aluminium nitride, aluminium trifluoride, or of amorphous silicon not intentionally doped. It may be deposited for example by ALD (atomic layer deposition) and may have a thickness for example from about ten nanometers to a few hundred nanometers, for example a thickness between 20 nm and 150 nm.

Figure 2B:
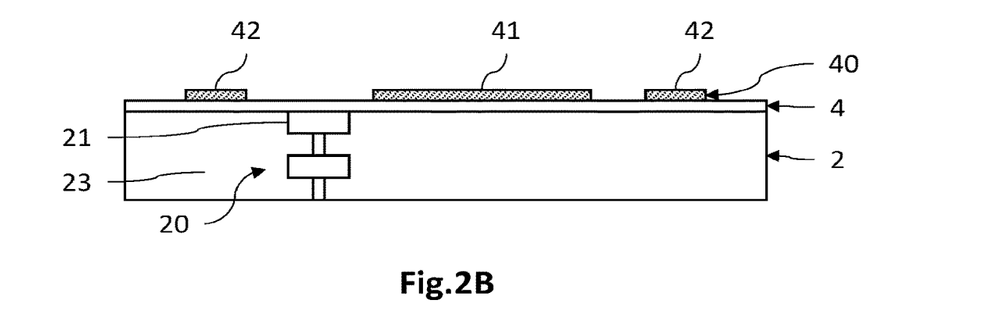

Referring to FIG. 2B, a gettering metallic layer 40 is then deposited on the etching barrier layer 4. This layer 40 comprises a metallic material suitable for providing a gettering effect, i.e. to pump, by absorption and/or adsorption, the gas molecules present in the sealed cavity 3. This gettering effect makes it possible to improve or maintain a required level of vacuum in the sealed cavity 3. This material is moreover substantially inert to chemical etching carried out subsequently to remove the carbonaceous sacrificial layer 50, in this case more precisely oxygen-plasma dry chemical etching. The metallic material is based on titanium, zirconium, vanadium, chromium, cobalt, iron, manganese, palladium, and/or aluminium, i.e. it comprises one of these metals or an alloy of these metals, such as TiZrV. Among these metals, titanium, zirconium, palladium and vanadium, and alloys thereof, have excellent chemisorption properties (gettering effect). The material may be deposited by the standard techniques of microelectronics, for example by cathode sputtering, by vacuum evaporation or chemical vapour deposition. The gettering metallic layer 40 may have a thickness from some tens of nanometers to some hundreds of nanometers, for example a thickness between 50 nm and 500 nm, or between 100 nm and 300 nm.

The gettering metallic layer 40 may consist of one and the same material or of several of the materials mentioned above. It may thus be formed of a stack of several so-called elementary layers, for example a bottom layer of 50 nm of titanium, an intermediate layer of 100 nm of aluminium and a top layer of 200 nm of titanium.

With the gettering metallic layer 40 made of one or more of said metallic materials, it may also provide, when it is located opposite the absorbent membrane 11, a function of optical reflection of the wavelengths intended to be detected, thus improving the sensitivity of the thermal detector 10.

The gettering metallic layer 40 may moreover provide an additional bonding function, to improve the adherence of the elements of the detecting device 1 on the substrate 2. Thus, titanium and chromium, among the list of materials mentioned above, have excellent properties of adherence.

The gettering metallic layer 40 extends discontinuously in this case and comprises portions that are separate from one another, obtained by conventional operations of photolithography and etching.

Thus, a first portion 41 has a large area, for example of the order of a pixel, optionally in the form of a rectangle or square, promoting the gettering function of chemical trapping of gas molecules. The first portion 41 advantageously extends under the absorbent membrane 11 so as to form a quarter-wave interference cavity with the latter, improving the sensitivity of the thermal detector 10.

A second portion 42 may advantageously be produced in a zone where an element of the detecting device 1 will be made, whose adherence to the substrate 2 will thus be reinforced by the quality of bonding provided by the gettering metallic layer 40. It may thus be located at the edge of the cavity 3, in order to receive the peripheral wall 33 of the encapsulating layer 31 that will be produced subsequently.

A third portion (not shown) may advantageously be produced at the level of portion 21 of the metal line and in a zone where the anchoring pillar 12 of the thermal detector 10 will be made. The anchoring pillar 12 can thus be in contact with the third portion of gettering metallic layer 40, the latter preferably being directly in contact with portion 21 of the metal line. This improves the quality of the electrical contact between the CMOS reading circuit 20 and the anchoring pillar 12, as well as the bond of the anchoring pillar on the substrate. This third portion is particularly advantageous when the etching barrier layer 4 is not present, as described later on, referring to FIG. 3.

Figure 2C:
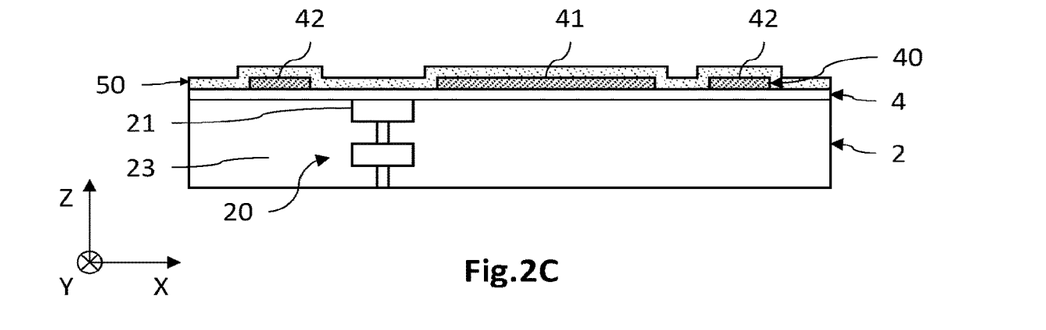

Referring to FIG. 2C, a protective sacrificial layer, called carbonaceous sacrificial layer 50, is then deposited so as to cover the gettering metallic layer 40 completely. Thus, the latter does not comprise a free surface, i.e. a surface accessible by an etching agent.

The carbonaceous sacrificial layer 50 comprises a carbonaceous material that can be etched selectively with respect to the gettering metallic layer 40, i.e. it can be removed during a chemical etching step employed subsequently, in this case more precisely oxygen-plasma dry chemical etching, without the gettering metallic layer 40 being degraded by this same chemical etching. It is moreover substantially inert with respect to further chemical etching carried out subsequently to remove mineral sacrificial layers 60A and 60B, such as chemical attack in an acid medium, for example with hydrofluoric acid in the vapour phase.

The carbonaceous material, i.e. a material comprising carbon atoms, is preferably selected from amorphous carbon, optionally of the DLC type, or even polyimide. In the case of carbon of the DLC type, the carbonaceous sacrificial layer 50 may have an electrical resistivity of the order of $10^6$ $\Omega \cdot cm$, which is advantageous for avoiding parasitic electrical coupling between two anchoring pillars 12 of one and the same thermal detector 10, when they are brought to different electric potentials during a step of electrical testing, said anchoring pillars 12 being in contact with the same carbonaceous sacrificial layer 50. As a variant (not shown), it is possible to perform localized etching of the carbonaceous sacrificial layer 50 to avoid any parasitic electrical coupling between the anchoring pillars 12 of one and the same thermal detector 10 via this carbonaceous sacrificial layer 50.

The carbonaceous material, when it is amorphous carbon, may be deposited as a thin layer by an appropriate deposition technique, such as plasma-enhanced chemical vapour deposition (PECVD), or physical vapour deposition (PVD) for example by ion-beam spraying (IBS) of a carbon target. In the case of polyimide, it can be deposited by spin coating.

The carbonaceous sacrificial layer 50 has a thickness between some tens of nanometers and some hundreds of nanometers, for example between 50 nm and 500 nm, or even between 100 nm and 300 nm, so as to obtain a good overlap of the flanks of portions 41, 42 of getter material.

The carbonaceous material is thus inert with respect to an etching agent used during the chemical etching carried out subsequently to remove the mineral sacrificial layers 60A, 60B, in particular hydrofluoric acid in the vapour phase. This is the case notably with amorphous carbon, which barely reacts with this etching agent. It is also the case with the polyimide, which reacts little with hydrofluoric acid, so that its full thickness has not been removed at the end of this step of wet chemical etching, the gettering metallic layer 40 thus remaining completely covered by a non-zero thickness of the carbonaceous sacrificial layer 50.

The carbonaceous material is, however, able to react with respect to an etching agent used during the chemical etching carried out subsequently to remove this carbonaceous sacrificial layer 50, in particular with respect to oxygen present in a plasma for dry chemical etching.

Figure 2D:
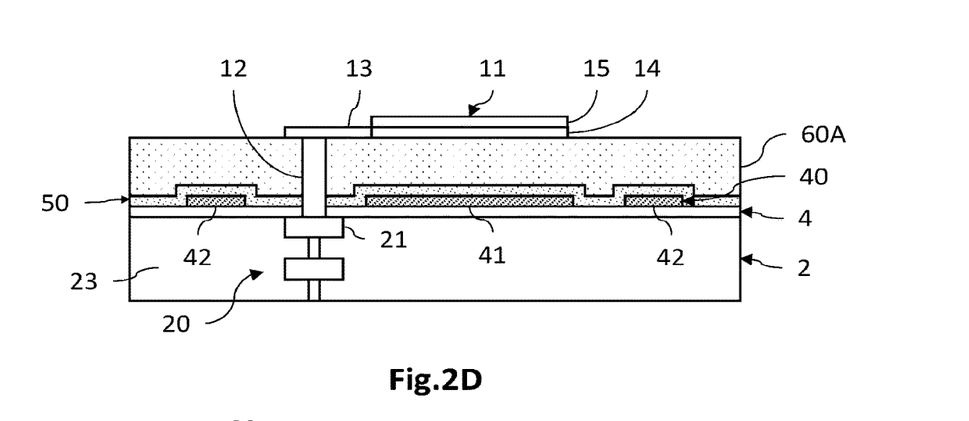

Referring to FIG. 2D, a first so-called mineral sacrificial layer is then deposited, comprising a mineral material, for example a silicon oxide $SiO_x$ deposited by PECVD. This mineral material is removable by wet chemical etching, in particular by chemical attack in an acid medium, the etching agent preferably being hydrofluoric acid in the vapour phase. This sacrificial mineral layer 60A is deposited in such a way that it extends continuously over more or less the entire surface of the substrate 2 and covers the carbonaceous sacrificial layer 50. It has a thickness, along the Z axis, which subsequently defines the distance between the absorbent membrane 11 and the substrate 2. This thickness is adjusted as a function of the absorption properties of the thermal detector 10 that we wish to obtain, and may be between 1 µm and 5 µm for detecting infrared radiation, for example it may be equal to about 2 µm.

Vertical holes are then made, which are intended for forming the anchoring pillars 12 of the thermal detector 10. They are produced by photolithography and etching, and they pass through the first sacrificial mineral layer 60A as well as the carbonaceous sacrificial layer 50 and the etching barrier layer 4, and open onto portion 21 of metal line. The vertical holes may have a cross-section in the (X,Y) plane of square, rectangular, or circular shape, with an area roughly equal for example to 0.25 µm$^2$.

The anchoring pillars 12 are then made in the vertical holes. They can be produced by filling the holes with one or more electrically conducting materials. As an example, they may each comprise a layer of TiN deposited by metal organic chemical vapour deposition (MOCVD) on the vertical flanks of the holes, and a core of copper or tungsten filling the space delimited transversely by the layer of TiN. A step of CMP, i.e. chemical-mechanical planarization, then provides planarization of the upper surface formed by the sacrificial mineral layer 60A and the anchoring pillars 12.

The inventors found that the mechanical durability of the sacrificial mineral layer 60A during the step of chemical-mechanical planarization is improved when the latter rests on the protective layer 50 of amorphous carbon. In fact, when the protective layer 50 is of polyimide, the step of chemical-mechanical planarization may lead to detachment of the sacrificial mineral layer 60A, notably owing to the mechanical action of the polishing head on layer 60A. The risk of such detachment occurring during the step of CMP is reduced when the protective layer 50 is of amorphous carbon, especially when the sacrificial mineral layer 60A is made of a silicon oxide $SiO_x$.

The absorbent membrane 11 and the heat-insulating holding arm 13 are then produced. This step may be carried out identically or similarly to that described in document EP2743659 and is not discussed in detail. Thus, the absorbent membrane 11 may comprise a material 15 suitable for absorbing the electromagnetic radiation of interest and a thermistor material 14, whose electrical conductivity varies as a function of the heating of the absorbent membrane 11. The materials selected for making the absorbent membrane 11 and the heat-insulating arm 13 may be selected from, among others, amorphous silicon, titanium nitride, aluminium, alumina, aluminium nitride, as they are substantially inert to the wet chemical etching carried out subsequently to remove the mineral sacrificial layers 60A, 60B. The absorbent membrane 11 is positioned so that it is opposite the first reflective portion 41 of the gettering metallic layer 40.

Figure 2E:
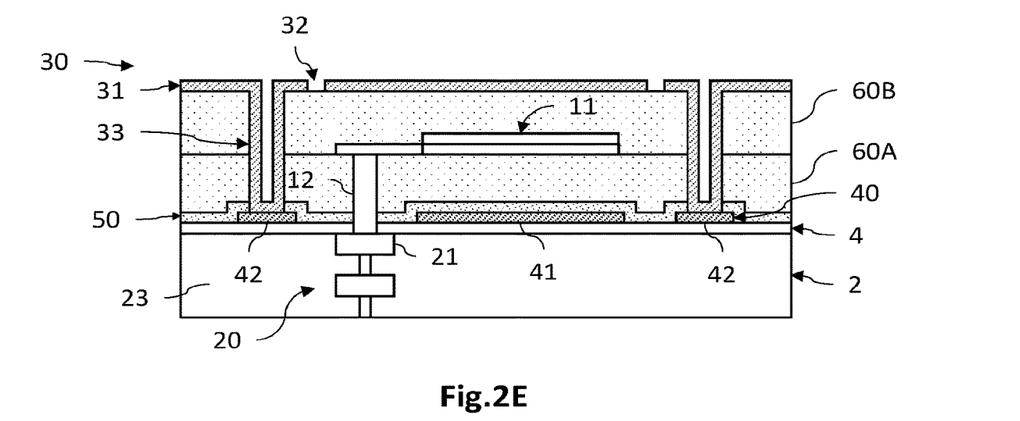

Referring to FIG. 2E, the encapsulating structure 30 is produced identically or similarly to that described in document EP2743659. In this case a second sacrificial mineral layer 60B is deposited on the first sacrificial mineral layer 60A, the anchoring pillars 12 and the heat-insulating arms 13, as well as on the absorbent membrane 11. It may be made of the same material as the first sacrificial mineral layer 60A and it has a thickness for example between 0.5 µm and 5 µm.

Trenches are then made through the full thickness of the mineral sacrificial layers 60A, 60B and of the carbonaceous sacrificial layer 50 so that, in this embodiment, they open onto the second bonding portions 42 of the gettering metallic layer 40. These trenches may be produced by steps of photolithography and etching, for example reactive ion etching (RIE). They may be produced so that they extend continuously around one or more thermal detectors 10 in the (X,Y) plane, depending on whether cavity 3 accommodates one or more pixels each comprising a thermal detector 10. They are intended for subsequent production of the peripheral wall 33 of the encapsulating structure 30. The bonding portions 42 of the gettering metallic layer 40 in this case form etch-stopping portions during formation of these trenches.

Then a thin encapsulating layer 31, transparent to the radiation to be detected, is deposited by a compatible deposition technique suitable for obtaining good covering of the vertical flanks of the trenches, with a roughly constant layer thickness. It may for example be a layer of amorphous silicon produced by CVD or iPVD, with a thickness typically between about 200 nm and 2000 nm when it is measured on a flat surface, and preferably of the order of 750 nm so as to form a quarter-wave plate with respect to a reference wavelength of 10 µm when the spectral range of detection of the thermal detector is LWIR (8 µm to 14 µm), thus improving the transmission of the incident radiation through this layer 31. Deposition of the encapsulating layer 31 on a surface structured by trenches including at least one continuous peripheral trench (closed perimeter) leads to formation of the capsule, made with the material of the encapsulating layer 31, forming, with the substrate 2, a cavity 3 in which one or more thermal detectors 10 are housed.

Through holes 32, forming release vents intended to allow evacuation of the sacrificial layers 60A, 60B, 50 from cavity 3, are then made by photolithography and etching in the encapsulating layer 31. Each vent 32 may be of square, rectangular, circular, or oblong shape. As an example, vents 32 may be of oblong shape, the length of which may be of the order of some microns, for example 5 µm, and the width may be of the order of about a hundred to several hundred nanometers, for example between 150 nm and 600 nm.

Figure 2F:
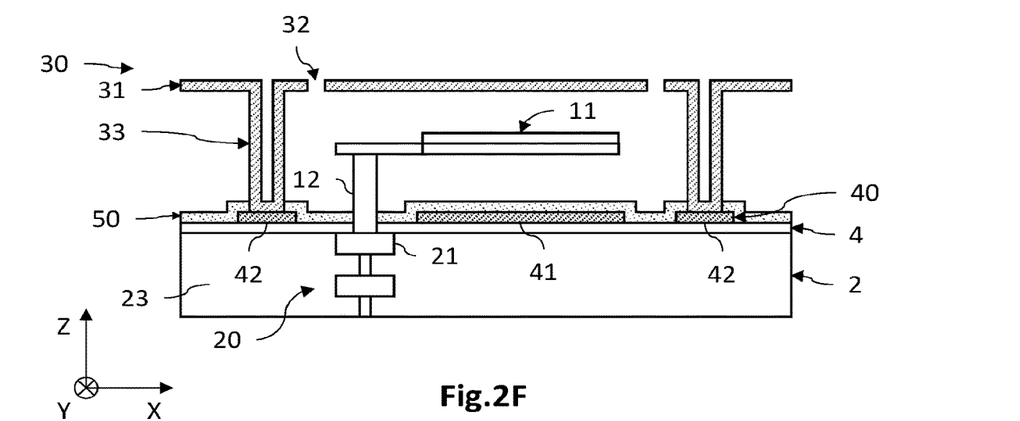

Referring to FIG. 2F, a first chemical etching is carried out to remove the two mineral sacrificial layers 60A, 60B, in this case by wet chemical etching by attack with hydrofluoric acid in the vapour phase, and thus form the cavity 3 housing the thermal detector or detectors 10. The products of the chemical reaction are evacuated through the release vents 32. As this wet chemical etching is isotropic, suspension of the absorbent membrane 11 is obtained, freeing the anchoring pillars 12 as well as the upper surface of the carbonaceous sacrificial layer 50. Etching by HF vapour attack is selective, so that the carbonaceous sacrificial layer 50 is not removed, the gettering metallic layer 40 then being fully protected against HF vapour attack.

Figure 2G:
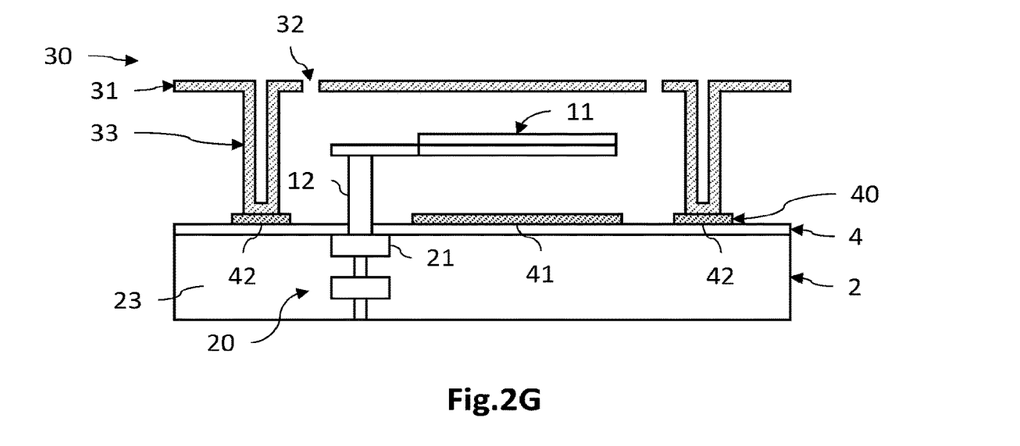

Referring to FIG. 2G, a second chemical etching is carried out to remove the carbonaceous sacrificial layer 50 and release the upper surface of the gettering metallic layer 40. Chemical etching is in this case dry chemical etching, the etching agent of which is oxygen present in a plasma. As this dry chemical etching is isotropic, the integrity of the structures released is preserved, while facilitating access of the etching agent to the cavity 3 through the release vents 32.

The inventors thus demonstrated that evacuation of the reaction products through the release vents 32 is possible and remains compatible, in terms of time for etching and removal, with the requirements for industrial application, whether the sacrificial layer 50 is formed of amorphous carbon or of polyimide.

Thus, the gettering metallic layer 40 is released, i.e. at least one part of its surface is not covered by another layer, and is therefore exposed to the atmosphere of the cavity 3.

Figure 2H:
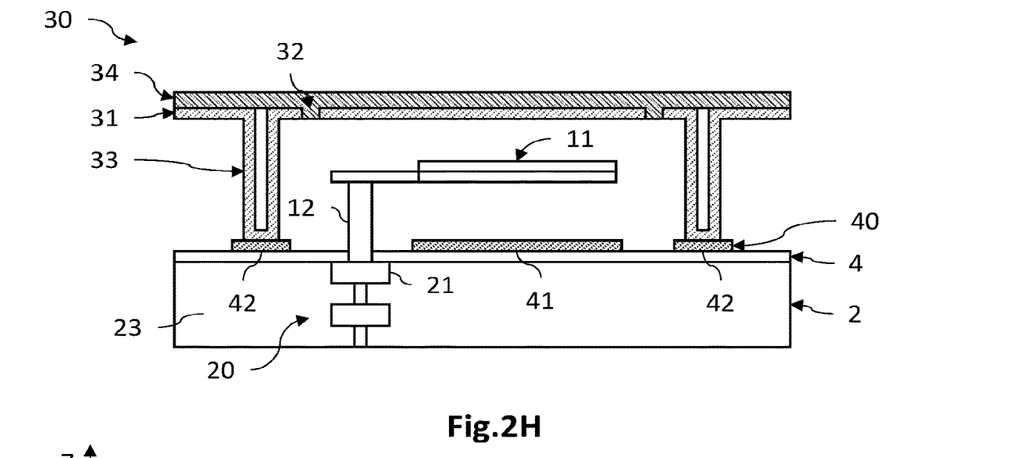

Referring to FIG. 2H, a sealing layer 34 is deposited on the encapsulating layer 31 with a thickness sufficient to ensure sealing, or clogging, of the release vents 32. The sealing layer 34 is transparent to the electromagnetic radiation to be detected and may have an antireflection function to optimize transmission of the radiation through the encapsulating structure 30. For this reason, it may be formed of sub-layers of germanium and of zinc sulphide in the case of radiation to be detected in the range of wavelengths from 8 µm to 12 µm, for example a first sub-layer of germanium of about 1.7 µm and then a second sub-layer of zinc sulphide of about 1.2 µm. The sealing layer 34 is preferably deposited by a technique of thin-film vacuum deposition, such as electron beam physical vapour deposition (EBPVD) or such as cathodic or ion-beam sputtering. We thus obtain a sealed cavity 3 under vacuum or reduced pressure, in which the thermal detector or detectors 10 are housed.

In addition, chemisorption of the gettering metallic layer 40 is activated by subjecting the detecting device 1 to a suitable heat treatment, in a furnace or a stove, in order to react the getter material with residual gas molecules present in the sealed cavity 3 and thus form stable chemical compounds. A level of vacuum is thus maintained or reduced inside the sealed cavity 3, thus improving the service life of the detecting device 1.

Thus, by depositing a gettering metallic layer 40 on the substrate 2, and protecting it with a carbonaceous sacrificial layer 50 with respect to the chemical etching employed in the step of removal of the mineral sacrificial layers 60A, 60B, a detecting device 1 is obtained comprising a gettering metallic layer 40 located on the substrate 2 and preserved against any degradation. The service life of the detecting device 1 made using at least one sacrificial mineral layer 60A, 60B is thus improved.

Moreover, in the case when the gettering metallic layer 40 is located underneath the absorbent membrane 11, as this gettering metallic layer 40 is reflective to the wavelengths to be detected, the sensitivity of the thermal detector 10 is improved, since the gettering metallic layer 40 is not covered with another layer, such as an etching barrier layer 4 as in the example from the prior art cited above.

Moreover, the gettering metallic layer 40 may also improve the bond of the encapsulating structure 30 on the substrate 2 and/or the bond and electrical contact of the anchoring pillar 12 with the portion 21 of metal line of the reading circuit 20.

Particular embodiments have just been described. A number of variants and modifications will be apparent to a person skilled in the art.

Figure 3:
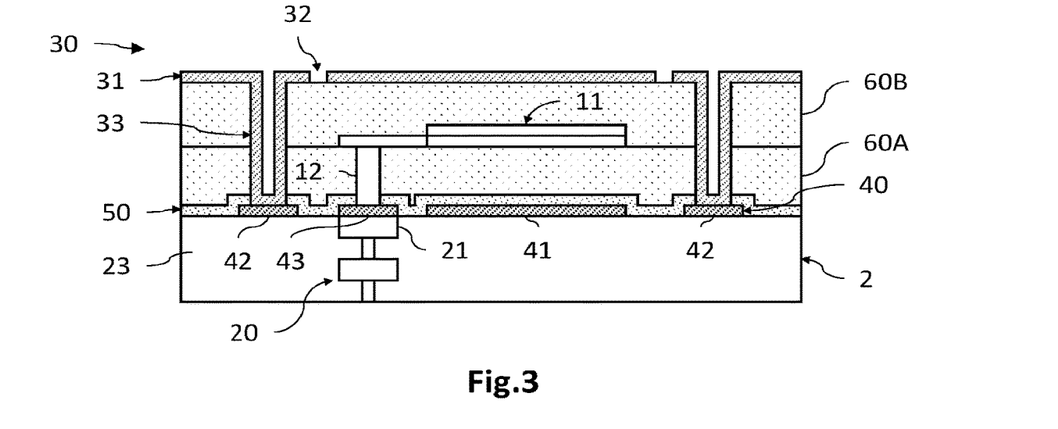
FIG. 3 is a schematic sectional view of a detecting device according to a second embodiment.

Thus, FIG. 3 illustrates a variant of the method for making the detecting device 1 in which the detecting device does not comprise an etching barrier layer 4. In this case FIG. 3 corresponds to a variant of the step illustrated in FIG. 2E. The gettering metallic layer 40 then rests directly on the upper surface of the substrate 2, and the carbonaceous sacrificial layer 50 extends continuously so as to cover the gettering metallic layer 40 but also the upper face of the substrate 2. It therefore provides an etching barrier function with respect to the chemical etching employed for removing the mineral sacrificial layers 60A, 60B, thus protecting both the gettering metallic layer 40 but also the intermetal dielectric layers 23 of mineral material present in the substrate 2.

In this example, the gettering metallic layer 40 comprises an additional portion 43 that rests on the upper surface of the substrate 2 and is arranged so as to be in contact with the first portion 21 of metal line of the reading circuit 20 on the one hand, and to provide bonding of the anchoring pillar 12 on the other hand. This thus improves the quality of the electrical contact between the reading circuit 20 and the anchoring pillar 12, as well as the bond of the anchoring pillar 12 on the substrate 2.

The method of fabrication then continues as described above with wet chemical etching of the mineral sacrificial layers 60A, 60B (FIG. 2F), and then dry etching of the carbonaceous sacrificial layer 50 by oxygen plasma (FIG. 2G), which exposes the zones of the upper face of the substrate 2 not covered by the portions 41, 42, 43 of the gettering metallic layer 40. The sealing layer 34 is finally deposited on the encapsulating layer 31 so as to seal the release vents 32 (FIG. 2H).

Figure 4:
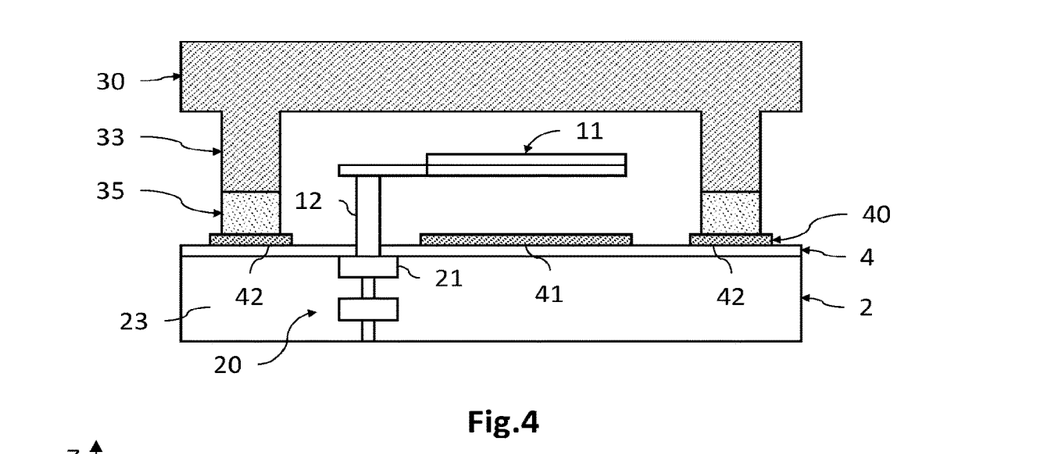
FIG. 4 is a schematic sectional view of a detecting device according to a third embodiment.

Furthermore, FIG. 4 illustrates another embodiment of the detecting device 1, which differs from that illustrated in FIG. 2H essentially in that the encapsulating structure 30 does not comprise an encapsulating layer 31 deposited by techniques of thin-film deposition, but an add-on rigid cover, i.e. prefabricated and then assembled on the substrate 2 so as to encapsulate one or more thermal detectors 10. The cover may be made from a silicon substrate 2 and is structured so as to comprise a peripheral wall 33 intended to be assembled on the substrate 2. The peripheral wall 33 is fixed to the substrate 2 via a hermetic seal 35, the latter preferably being in contact with a bonding portion 42 of the gettering metallic layer 40. The hermetic seal 35 may be obtained by melting a fusible metal or by forming an intermetallic alloy.

The method of fabrication in this embodiment differs in this case from that described with reference to FIGS. 2A to 2H in that, following deposition of the first sacrificial mineral layer 60A and production of the anchoring pillar 12, the heat-insulating arm 13, and the absorbent membrane 11 and deposition of the second sacrificial mineral layer 60B, a sealing material intended to form the hermetic seal 35 is deposited in a trench made by localized etching of the mineral sacrificial layers 60a, 60B and of the carbonaceous sacrificial layer 50. Then the mineral sacrificial layers 60A, 60B and then the carbonaceous sacrificial layer 50 are removed by etching. The cover is then assembled on the substrate 2.

Other variants are possible, such as encapsulation of the detecting device 1 in a casing in which the thermal detector or detectors 10 and the substrate 2 are housed together. The casing, made for example of metallic materials or of ceramic materials, then comprises a window that is transparent to the wavelengths to be detected and is located opposite the thermal detector or detectors 10.

The invention claimed is:

1. A method for making an electromagnetic radiation detecting device comprising at least one thermal detector, the latter comprising an absorbent membrane suitable for absorbing the radiation to be detected, suspended above a substrate, the thermal detector being intended to be located in a sealed cavity, said method comprising at least the following steps:
   depositing, on the substrate, a gettering metallic layer comprising a metallic material with a gettering effect;
   depositing, so as to cover the gettering metallic layer, a carbonaceous sacrificial layer comprising a carbonaceous material of amorphous carbon that can be etched selectively with respect to the gettering metallic layer by a second chemical etching;
   depositing, on the carbonaceous sacrificial layer, at least one sacrificial mineral layer comprising a mineral material that can be etched selectively with respect to the carbonaceous sacrificial layer by a first chemical etching;
   chemical-mechanical planarization of the sacrificial mineral layer;
   fabricating the thermal detector so that the absorbent membrane is produced on the sacrificial mineral layer;
   removing the sacrificial mineral layer by said first chemical etching; and
   removing the carbonaceous sacrificial layer by said second chemical etching.

2. The method according to claim 1, wherein the metallic material with a gettering effect is selected from titanium, zirconium, vanadium, chromium, cobalt, iron, manganese, palladium, barium, and/or aluminium.

3. The method according to claim 1, wherein the mineral material is a material comprising at least silicon oxide or silicon nitride.

4. The method according to claim 1, wherein the first chemical etching is chemical attack in an acid medium.

5. The method according to claim 1, wherein the second chemical etching is dry etching by oxygen plasma.

6. The method according to claim 1, wherein the gettering metallic layer rests on and is in contact with an electrically insulating layer of the substrate, or rests on and is in contact with an etching barrier layer made of a material that is able to stop the first chemical etching and that covers an upper face of the substrate.

7. The method according to claim 1, wherein the carbonaceous sacrificial layer covers the gettering metallic layer.

8. The method according to claim 1, wherein the gettering metallic layer comprises several separate portions, of which at least a first portion is located under the absorbent membrane.

9. The method according to claim 1, wherein the step of fabricating the thermal detector comprises the formation of an encapsulating structure of said thermal detector, the encapsulating structure comprising an encapsulating layer extending around and above said thermal detector so as to define, with the substrate, the sealed cavity in which said thermal detector is located, the encapsulating layer comprising at least one through hole, called a release vent; and in which materials removed during the first and second chemical etchings are evacuated through said release vent.

10. The method according to claim 9, wherein the encapsulating layer is formed of at least one material comprising silicon.

11. The method according to claim 9, wherein the encapsulating layer comprises a peripheral wall that extends around said thermal detector, and is in contact with the gettering metallic layer.

12. The method according to claim 1, wherein the thermal detector comprises at least one anchoring pillar for holding the absorbent membrane in place above the substrate, the anchoring pillar being in contact with the gettering metallic layer.

13. The method according to claim 4, wherein the acid medium includes hydrofluoric acid in a vapour phase.

* * * * *